United States Patent
Zhang et al.

(10) Patent No.: US 10,344,209 B2
(45) Date of Patent: Jul. 9, 2019

(54) WHITE-LIGHT FLUORESCENT MATERIAL, AND MANUFACTURING METHOD AND USE THEREOF

(71) Applicant: BOE TECHNOLOGY GROUP CO., LTD., Beijing (CN)

(72) Inventors: Wei Zhang, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 344 days.

(21) Appl. No.: 15/156,945

(22) Filed: May 17, 2016

(65) Prior Publication Data
US 2017/0037310 A1 Feb. 9, 2017

(30) Foreign Application Priority Data
Aug. 7, 2015 (CN) .......................... 2015 1 0484123

(51) Int. Cl.
*H01L 33/50* (2010.01)
*C09K 11/66* (2006.01)

(52) U.S. Cl.
CPC .......... *C09K 11/661* (2013.01); *H01L 33/502* (2013.01); *Y02B 20/181* (2013.01)

(58) Field of Classification Search
None
See application file for complete search history.

(56) References Cited

U.S. PATENT DOCUMENTS

| 5,028,509 A | * | 7/1991 | Shimada | ........... C09K 11/61 250/484.4 |
| 6,191,062 B1 | * | 2/2001 | Hayakawa | ........... B01J 35/002 427/126.1 |
| 6,555,594 B1 | * | 4/2003 | Fukushima | ........... C08F 2/44 315/169.3 |

FOREIGN PATENT DOCUMENTS

| CN | 102031108 | * | 4/2011 |
| CN | 102336431 A | * | 2/2012 |

(Continued)

OTHER PUBLICATIONS

Xiao Zhenghua, et al. "Ag/SnO2 Synthesized by Photoreduction Method and the Photocatalysis Decolorization Study Thereof." Journal of Sichuan University of Science and Engineering vol. 26, Issue 4, Aug. 2013. pp. 15-17, 34.*

(Continued)

*Primary Examiner* — Matthew J Daniels
*Assistant Examiner* — Mohammad M Ameen
(74) *Attorney, Agent, or Firm* — Harness, Dickey & Pierce, P.L.C.

(57) ABSTRACT

The present disclosure discloses a fluorescent material and a manufacturing method and use thereof. The fluorescent material comprises $SnO_2$ doped with Ag, wherein the molar ratio of Ag to $SnO_2$ is 0.0014-0.007:1. The fluorescent material can emit fluorescent lights of two different colors which are complementary colors of each other, and the fluorescent material has a long service life. The fluorescent material is synthesized via a hydrothermal method under air atmosphere by using $SnCl_4 \cdot 5H_2O$ as a raw material. The method for manufacturing the fluorescent material is easy and simple, and significant economic and social benefits can be obtained when it is popularized and applied in the fields of illumination and display. The fluorescent material can be employed for manufacturing white-light fluorescent powder (Continued)

used in a white-light LED excitable by an ultraviolet-near ultraviolet LED diode chip.

12 Claims, 2 Drawing Sheets

(56) References Cited

FOREIGN PATENT DOCUMENTS

| CN | 103059846 A | 4/2013 |
|----|-------------|--------|
| CN | 103849389 A | 6/2014 |
| CN | 104402041 A | 3/2015 |
| JP | S56876 A | 1/1981 |

OTHER PUBLICATIONS

First Chinese Office Action regarding Application No. 201510484123.1 dated May 19, 2016. English translation provided by Dragon Intellectual Property Law Firm.

Wang, Peng-wei et al: "Synthesis, Structure and Optical Properties of Ag Doped $SnO_2$ Nanowires," Journal of Chinese Electron Microscopy Society, vol. 27, No. 4, Aug. 2008, pp. 261-265.

Wang, Xin, et al. "Self-assemble flower-like $SnO_2$/Ag heterostructures: Correlation amond composition, structure and photocatalytic activity," Colloids and Surfaces A: Physicochemical and Engineering Aspects, vol. 419, 2013, pp. 140-146.

Li, Li et al. "Preparation of Ag/ZnO—SnO2 by CTAB-assisted and Photocatalytic Degradation of Rhodamine B," Chemical Journal of Chinese Universities, vol. 33, No. 6, Jun. 2012, pp. 1264-1270.

Xiao, Zheng-hua et al. "Photocatalytic Activity of Ag/$SnO_2$ Prepared by Photodepsition Method," Journal of Sichuan University of Science & Engineering (Natural Science Edition), vol. 26, No. 4, Aug. 2013, pp. 15-18.

Fang, L.M. et al. "Microstructure and Luminescence Properties of Co-doped $SnO_2$ Nanoparticles Synthesized by Hydrothermal Method," Journal of Materials Science: Materials in Electronics, vol. 19, 2008, pp. 868-874.

Psuja, P. et al. "Influence of Concentration and Sintering Temperature on Luminescence Properties of $Eu^{3+:\ SnO_2}$ Nanocrystallites," Journal of Rare Earths, vol. 30, No. 7, Jul. 2012, pp. 627-631.

Second Office Action regarding Chinese application No. 201510484123. 1, dated Oct. 25, 2016. Translation provided by Dragon Intellectual Property Law Firm.

\* cited by examiner

WHITE-LIGHT FLUORESCENT MATERIAL, AND MANUFACTURING METHOD AND USE THEREOF

CROSS-REFERENCE TO RELATED APPLICATION

This application claims priority to Chinese Patent Application No. 201510484123.1 filed on Aug. 7, 2015, the disclosures of which are incorporated in their entirety by reference herein.

TECHNICAL FIELD

The present disclosure relates to the field of photoluminescence technologies, and in particular to a fluorescent powder for Light-Emitting Diode (LED).

BACKGROUND

There are mainly three methods for obtaining white light by using fluorescent powder in a Light-Emitting Diode (LED), but they are not fully mature methods, which severely limits the use of white-light LED in the field of illumination. Specifically, in the first method, yellow fluorescent powder that may be excited by blue light is coated on a blue LED chip, and the blue light emitted by the chip and the yellow light emitted by the fluorescent powder are complementary to each other so as to form a white light. This technology is engrossed by Nichia Company in Japan, and a theoretical disadvantage of such a solution is that the emission spectrum of $Ce^{3+}$ ions in the fluorophor does not have a continuous spectral characteristic and the color rendering property thereof is poor, thus it is difficult to meet the requirement of low-color temperature illumination, and at the same time, the luminescence efficiency is not high enough, and it needs to be improved by developing novel high-efficiency fluorescent powders.

In the second method, green and red fluorescent powders are coated on a blue LED chip, and the blue light emitted by the chip and the green light and red light emitted by the fluorescent powder are combined so as to obtain a white light, with a good color rendering property. However, the fluorescent powders employed in such a method have a low effective conversion efficiency, especially, the effective conversion efficiency of the red fluorescent powder needs to be improved greatly.

In the third method, fluorescent powders of three primary colors or multiple colors are coated on a violet-light or ultraviolet-light LED chip, and the emission of white light is realized by exciting fluorescent powders via the long-wave ultraviolet light (370 nm-380 nm) or violet light (380 nm-410 nm) emitted by the chip. The color rendering property in this method is better, but a problem similar to that of the second method still exists that the effective conversion efficiency of the fluorescent powders is low; moreover, in the current red and green fluorescent powders which are of a high conversion efficiency usually contains a sulfide system, and such fluorescent powders are of a poor luminescence stability and a large light attenuation.

It is difficult to control the homogeneity of the existing fluorescent powders, so that the luminescence effect of a final luminaire will be influenced. As a result, it has become an urgent task to develop a high-efficiency and low-light attenuation fluorescent powder for a white-light LED.

SUMMARY

It is an object of the present disclosure to provide a fluorescent material, the fluorescent material can emit fluorescent lights of two different colors which are complementary colors of each other, moreover, the fluorescent material has a long service life.

Based on the object of the present disclosure, in one embodiment, the white-light fluorescent material of the present disclosure comprises $SnO_2$ doped with Ag wherein a molar ratio of Ag to $SnO_2$ is 0.007-0.0014:1.

In one example, the molar ratio of Ag to $SnO_2$ may be 0.0014-0.0056:1; in a further example, the molar ratio of Ag to $SnO_2$ may be 0.0037-0.0056:1.

In one example, the white-light fluorescent material may be nanoscale powder.

It is another object of the present disclosure to provide a method for manufacturing the above white-light fluorescent material.

In one embodiment, the method for manufacturing the white-light fluorescent material of the present disclosure includes:

step 1, preparing a precursor by using $SnCl_4 \cdot 5H_2O$ as a raw material;

step 2, dissolving NaOH and a surfactant in water and then mixing NaOH and the surfactant, and stirring at room temperature for 0.5-2 h, thus obtaining a mineralizer, wherein a mass ratio of NaOH to the surfactant is 1:1-1:1.5;

step 3, mixing the precursor and the mineralizer and then stirring for homogenization, placing a resultant mixture into a hydrothermal reactor, reacting at 135-145° C. for 12-18 h, cooling the mixture to room temperature and then taking out a product obtained, diluting the product with deionized water and then adjusting a pH value of a system to neutral with dilute nitric acid, adding silver nitrate, and irradiating the system with ultraviolet light while stirring, then drying and grinding, thus obtaining fluorescent powder of $SnO_2$ doped with Ag, wherein a molar ratio of Ag to $SnO_2$ is 0.0014-0.007:1;

here, a molar ratio of silver nitrate added in step 3 to $SnCl_4 \cdot 5H_2O$ in the precursor is 0.0014-0.007:1.

In one example, step 1 of preparing the precursor may include: obtaining $SnCl_4 \cdot 5H_2O$, adding an excessive amount of ammonia water until precipitate is no longer generated, filtering out the precipitate and washing the precipitate with deionized water for several times until no $Cl^-$ is contained, adding deionized water to the precipitate with a mass ratio of $SnCl_4 \cdot 5H_2O$ to the deionized water being 1:3.5-1:4, and shaking to form an emulsion, adjusting a pH value to 10.5 with ammonia water, placing the emulsion in a hydrothermal reactor, and holding the reactor at 180° C. for 4 h, cooling to room temperature and then taking out the product obtained, thus obtaining the precursor.

In one example, the surfactant in step 2 may be cetyl trimethyl ammonium bromide.

In one example, the concentration of NaOH in the reaction system obtained by mixing the precursor and the mineralizer in step 3 may be 0.25-0.45 mol/L, and in a further example, it may be 0.35 mol/L.

In one example, the concentration of the surfactant in the reaction system obtained by mixing the precursor and the mineralizer in step 3 may be 10-20 g/L, and in a further example, it may be 15 g/L.

In one example, the irradiation intensity of the ultraviolet light in step 3 is 160 µW/cm²-180 µW/cm², and in a further example, it may be 180 µW/cm²; the irradiation time of the ultraviolet light may be 1-2 h, and in a further example, it may be 2 h.

In one example, the drying in step 3 is performed at 70° C.

In one example, the step of mixing the precursor and the mineralizer and then stirring for homogenization, placing the resultant mixture into a hydrothermal reactor, reacting at 135-145° C. for 12-18 h in step 3 may comprise: mixing the precursor and the mineralizer and then stirring for homogenization, placing the resultant mixture into the hydrothermal reactor, and reacting at 140° C. for 16 h.

In the above examples, $SnCl_4 \cdot 5H_2O$ is used as the source of tin in the manufacturing method of the present disclosure, the precursor and the mineralizer prepared are mixed homogeneously and then reacted in a hydrothermal reactor, the product obtained is diluted with deionized water and then the pH value of the system is adjusted to neutral with dilute nitric acid, a certain amount of silver nitrate is added according to the compounding ratio in the chemical general formula, and the system is irradiated with ultraviolet light for 2 h while stirring according to the photodecomposition feature of silver nitrate, and then it is dried at 70° C., a small amount of elementary silver is dispersed in $SnO_2$, thus an $Ag_xSnO_2$ fluorescent powder is obtained (x=0.007-0.0014). The manufacturing method is simple and easy to be industrialized.

In one embodiment, the present disclosure further provides use of the above white-light fluorescent material in the manufacture of a white-light fluorescent powder used in an LED.

In one example, the LED is a white-light LED excitable by an ultraviolet-near ultraviolet LED diode chip.

In one example, the white-light fluorescent material is coated on a location excitable by ultraviolet light inside the LED.

In one embodiment, the present disclosure further provides an LED device, which includes a fluorescent layer manufactured by the white-light fluorescent material of the present disclosure.

The present disclosure has the following beneficial effects:

The fluorescent material of the present disclosure has an excellent chemical stability and a high excitation efficiency, and it can emit fluorescence of two different colors which are complementary colors of each other. Therefore, it is hopeful to become a novel fluorescent powder for white-light LED.

The $Ag_xSnO_2$ fluorescent powder of the present disclosure can emit a blue light with a wavelength of 400-500 nm and a yellow light with a wavelength of about 570 nm which are just complementary colors when the two lights are mixed, and thus can realize white fluorescence. The white-light fluorescent material of the present disclosure may be used for manufacturing a white-light fluorescent powder used in a white-light LED excitable by an ultraviolet-near ultraviolet LED diode chip.

By changing the amount of the surfactant and the amount of elementary silver, a fluorescent powder can be obtained that emits fluorescent lights of two different colors which are complementary colors of each other. The luminescence effect and the service life are greatly related to the ratio of silver; in regards to the $Ag_xSnO_2$ fluorescent powder of the present disclosure, the value range of x is between 0.0014-0.007, that is, the molar ratio of silver particulates to $SnO_2$ is 0.0014-0.007:1, and in one example, the molar ratio of Ag to $SnO_2$ may be 0.0014-0.0056:1; in a further example, the molar ratio of Ag to $SnO_2$ may be 0.0037-0.0056:1. The doping of silver particulates may prevent the aggregation of $SnO_2$ particulate to a certain extent, and the LED service life is prolonged. All methods for manufacturing a fluorescent material by changing the silver content and the silver nano topography fall into the protection scope of the present disclosure.

In the method for manufacturing a fluorescent powder for white-light LED according to the present disclosure, $SnCl_4 \cdot 5H_2O$ is used as the raw material, and the fluorescent powder is synthesized via a hydrothermal method under air atmosphere. The fluorescent powder prepared by the manufacturing method has a good homogeneity; moreover, the method for manufacturing the fluorescent powder is easy and simple, it can be popularized and applied in the fields of illumination and display, and significant economic and social benefits may be obtained.

DETAILED DESCRIPTION

The implementation of the present disclosure will be further described in detail below in conjunction with the drawings and embodiments. The following embodiments are only used for illustrating the present disclosure exemplarily, rather than limiting the scope of the present disclosure.

One implementation of the present disclosure provides a white-light fluorescent material, which comprises $SnO_2$ doped with Ag wherein the molar ratio of Ag to $SnO_2$ 0.007-0.0014:1. Preferably, the molar ratio of Ag to $SnO_2$ is 0.0014-0.0056:1; most preferably, the molar ratio of Ag to $SnO_2$ is 0.0037-0.0056:1.

The white-light fluorescent material is nanoscale powder.

Further, one implementation of the present disclosure provides a method for manufacturing the above white-light fluorescent material. In the manufacturing method of the present disclosure, $SnCl_4 \cdot 5H_2O$ is used as the source of tin, the precursor and the mineralizer prepared are mixed homogeneously and then reacted in a hydrothermal reactor, the product obtained is diluted with deionized water and then the pH value of the system is adjusted to neutral with dilute nitric acid, a certain amount of silver nitrate is added according to the compounding ratio in the chemical general formula, and the system is irradiated by ultraviolet light for 2 h while stirring according to the photodecomposition feature of silver nitrate, and then it is dried at 70° C., a small amount of elementary silver is dispersed in $SnO_2$, thus an $Ag_xSnO_2$ fluorescent powder is obtained. The manufacturing method is simple and easy to be industrialized.

Figure 3:
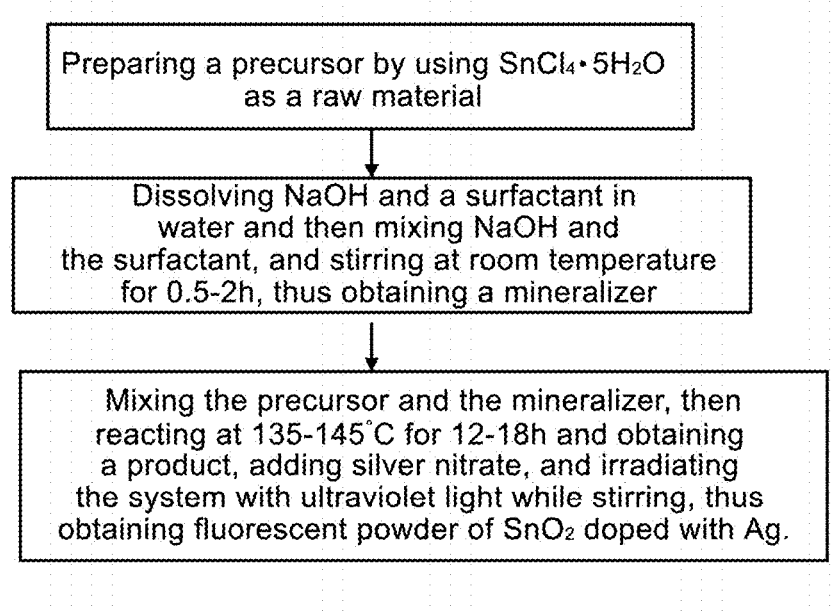
FIG. 3 shows the flow chart of a method for manufacturing a fluorescent powder for white-light LED according to the present disclosure.

As shown in FIG. 3, the method for manufacturing the white-light fluorescent material according to one embodiment of the present disclosure includes:

step 1, preparing a precursor by using $SnCl_4 \cdot 5H_2O$ as the raw material;

step 2, dissolving NaOH and a surfactant in water and then mixing NaOH and the surfactant, and stirring at room temperature for 1 h, thus obtaining a mineralizer, wherein the mass ratio of NaOH to the surfactant is 1:1-1:1.5;

step 3, mixing the precursor and the mineralizer and then stirring for homogenization, placing a resultant mixture into a hydrothermal reactor, reacting at 135-145° C. for 12-18 h, cooling the mixture to room temperature and then taking out the product obtained, diluting the product with deionized water and then adjusting the pH value of the system to neutral with dilute nitric acid, adding silver nitrate, and irradiating the system with ultraviolet light while stirring, then drying and grinding, thus obtaining fluorescent powder of $SnO_2$ doped with Ag, wherein the molar ratio of Ag to $SnO_2$ is 0.0014-0.007:1;

here, the molar ratio of silver nitrate added in step 3 to the $SnCl_4 \cdot 5H_2O$ in the precursor is 0.0014-0.007:1.

Step 1 of preparing the precursor includes: obtaining $SnCl_4 \cdot 5H_2O$, adding an excessive amount of ammonia water until precipitate is no longer generated, filtering out the precipitate and washing with deionized water for several times until no $Cl^-$ is contained, adding deionized water to the precipitate with a mass ratio of $SnCl_4 \cdot 5H_2O$ to the deionized water being 1:3.5-1:4, and shaking to form an emulsion, adjusting the pH value to 10.5 with ammonia water, placing the emulsion in a hydrothermal reactor, and holding the reactor at 180° C. for 4 h, then cooling to room temperature and taking out the product obtained, thus obtaining the precursor.

In step 2, the surfactant is cetyl trimethyl ammonium bromide.

In step 3, the concentration of NaOH in the reaction system obtained by mixing the precursor and the mineralizer is 0.25-0.45 mol/L, and preferably 0.35 mol/L.

In step 3, the concentration of the surfactant in the reaction system obtained by mixing the precursor and the mineralizer is 10-20 g/L, and preferably 15 g/L.

In step 3, the irradiation intensity of the ultraviolet light is 160 $\mu W/cm^2$180 $\mu W/cm^2$, preferably 180 $\mu W/cm^2$; and the irradiation time of the ultraviolet light is 1-2 h, preferably 2 h.

In step 3, the drying is performed at 70° C.

In step 3, the precursor and the mineralizer are mixed and then stirred for homogenization, and the resultant mixture is placed in a hydrothermal reactor and is reacted at 140° C. for 16 h.

Embodiments

Embodiment 1: Preparation of $Ag_xSnO_2$ Fluorescent Powder

A flow chart of the preparation of $Ag_xSnO_2$ fluorescent powder is as shown in FIG. 3, which includes:

Step 1: weighing out 10 g $SnCl_4 \cdot 5H_2O$, adding an excessive amount of ammonia water until precipitate is no longer generated, filtering out the precipitate and washing the precipitate with deionized water for several times until no $Cl^-$ is contained, adding water to about 40 mL with the mass ratio of $SnCl_4 \cdot 5H_2O$ to the deionized water being about 1:3.5, and shaking to form an emulsion, adjusting the pH value to be about 10.5 with ammonia water, placing the emulsion into a 50 mL hydrothermal reactor, and holding the reactor at 180° C. for 4 h, cooling to room temperature and then taking out the product, thus obtaining a precursor.

Step 2: weighing out 0.6 g NaOH, dissolving NaOH in 20 mL deionized water, stirring at room temperature and then adding 0.6 g surfactant CTAB (cetyl trimethyl ammonium bromide) wherein the mass ratio of NaOH to CTAB is 1:1, and stirring at room temperature for 1 h, thus obtaining a mineralizer.

Figure 1:
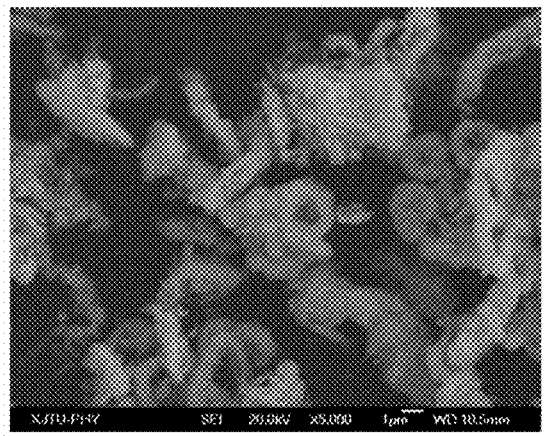
FIG. 1 shows a scanning electron microscopic image of the fluorescent powder $Ag_xSnO_2$ according to the present disclosure.

Step 3: mixing the precursor and the mineralizer and then stirring for homogenization, placing the resultant mixture into a 100 mL hydrothermal reactor, and reacting at 140° C. for 16 h, cooling the mixture to room temperature and then taking out the product obtained, diluting the product with deionized water and then adjusting the pH value of the system to neutral with dilute nitric acid, adding 0.02 g silver nitrate, irradiating the system with ultraviolet light (180 $\mu W/cm^2$) for 2 h while stirring, and then drying at 70° C., and grinding by using a ball mill, thus obtaining $Ag_xSnO_2$ fluorescent powder (as shown in FIG. 1) wherein x=0.0014.

Figure 2:
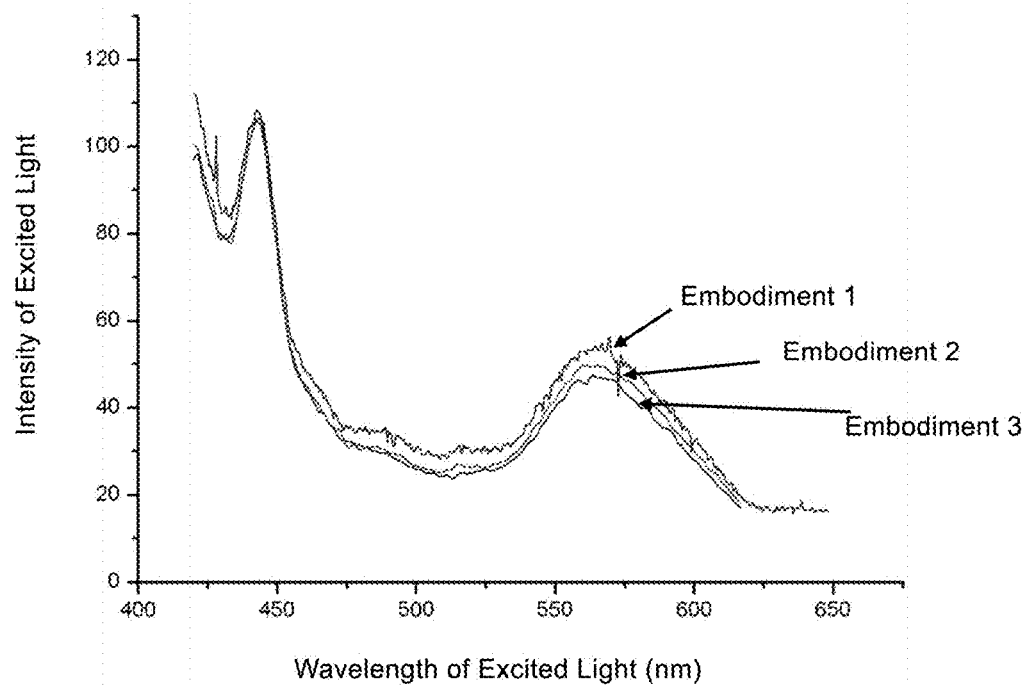
FIG. 2 shows the wavelength of the fluorescence emitted by the fluorescent powder according to the present disclosure (wherein the Y-axis represents the intensity of the excited light after ultraviolet light irradiation, and the x-axis represents the excited light wavelength)

As shown in FIG. 2, the $Ag_{0.0014}SnO_2$ fluorescent powder emits blue light with a wavelength of 440 nm and yellow light with a wavelength of about 570 nm under the excitation of ultraviolet light (200-400 nm) wherein the blue light and the yellow light, when mixed, are just complementary colors of each other, and thus can realize white fluorescence.

Embodiment 2: Preparation of $Ag_xSnO_2$ Fluorescent Powder

A flow chart of the preparation of $Ag_xSnO_2$ fluorescent powder is as shown in FIG. 3, which includes:

Step 1: weighing out 10 g $SnCl_4 \cdot 5H_2O$, adding an excessive amount of ammonia water until precipitate is no longer generated, filtering out the precipitate and washing the precipitate with deionized water for several times until no $Cl^-$ is contained, adding water to about 40 mL with the mass ratio of $SnCl_4 \cdot 5H_2O$ to the deionized water being about 1:3.5, and shaking to form an emulsion, adjusting the pH value to be about 10.5 with ammonia water, placing the emulsion into a 50 mL hydrothermal reactor, and holding the reactor at 180° C. for 4 h, cooling to room temperature and then taking out the product, thus obtaining a precursor.

Step 2: weighing out 0.6 g NaOH, dissolving NaOH in 20 mL deionized water, stirring at room temperature and then adding 0.6 g surfactant CTAB (cetyl trimethyl ammonium bromide) wherein the mass ratio of NaOH to CTAB is 1:1, and stirring at room temperature for 1 h, thus obtaining a mineralizer.

Step 3: mixing the precursor and the mineralizer and then stirring for homogenization, placing the resultant mixture into a 100 mL hydrothermal reactor, and reacting at 140° C. for 16 h, cooling the mixture to room temperature and then taking out the product obtained, diluting the product with deionized water and then adjusting the pH value of the system to neutral with dilute nitric acid, adding 0.08 g silver nitrate, irradiating the system with ultraviolet light (180 $\mu W/cm^2$) for 2 h while stirring, and then drying at 70° C., and grinding by using a ball mill to obtain $Ag_xSnO_2$ fluorescent powder, wherein x=0.0056.

As shown in FIG. 2, the $Ag_{0.0056}SnO_2$ fluorescent powder emits blue light with a wavelength of 440 nm and yellow light with a wavelength of about 570 nm under the excitation of ultraviolet light (200-400 nm), wherein the blue light and the yellow light, when mixed, are just complementary colors of each other, and thus can realize white fluorescence.

Embodiment 3: Preparation of $Ag_xSnO_2$ Fluorescent Powder

A flow chart of the preparation of $Ag_xSnO_2$ fluorescent powder is as shown in FIG. 3, which includes:

Step 1: weighing out 15 g $SnCl_4 \cdot 5H_2O$, adding an excessive amount of ammonia water until precipitate is no longer generated, filtering out the precipitate and washing the precipitate with deionized water for several times until no $Cl^-$ is contained, adding water to about 40 mL with the mass ratio of $SnCl_4 \cdot 5H_2O$ to the deionized water being about 1:4, and shaking to form an emulsion, adjusting the pH value to be about 10.5 with ammonia water, placing the emulsion into a 50 mL hydrothermal reactor, and holding the reactor at 180° C. for 4 h, cooling to room temperature and then taking out the product, thus obtaining a precursor.

Step 2: weighing out 1 g NaOH, dissolving NaOH in 20 mL deionized water, and stirring at room temperature and then adding 1 g surfactant CTAB (cetyl trimethyl ammonium bromide) wherein the mass ratio of NaOH to CTAB is 1:1.5, and stirring at room temperature for 1 h, thus obtaining a mineralizer.

Step 3: mixing the precursor and the mineralizer and then stirring for homogenization, placing the resultant mixture into a 100 mL hydrothermal reactor, and reacting at 140° C. for 16 h, cooling the mixture to room temperature and then taking out the product obtained, diluting the product with deionized water and then adjusting the pH value of the system to neutral with dilute nitric acid, adding 0.08 g silver nitrate, irradiating the system with ultraviolet light (180 $\mu W/cm^2$) for 2 h while stirring, and then drying at 70° C., and grinding by using a ball mill to obtain $Ag_xSnO_2$ fluorescent powder, wherein x=0.0037.

As shown in FIG. 2, the $Ag_{0.0037}SnO_2$ fluorescent powder emits blue light with a wavelength of 440 nm and yellow light with a wavelength of about 570 nm under the excitation of ultraviolet light (200-400 nm) wherein the blue light and the yellow light, when mixed, are just complementary colors of each other, and thus can realize white fluorescence.

As shown in FIG. 2, it shows the wavelength curves of the fluorescence emitted, under the excitation of ultraviolet light, by the fluorescent powders prepared in Embodiments 1-3. Although the raw materials are somewhat different, the frequency ranges of the fluorescence emitted by the fluorescent powders are quite stable.

The above description only shows some preferred embodiments of the present disclosure. It should be noted that, various improvements and substitutions may also be made by one of ordinary skills in the art without departing from the technical principles of the present disclosure, and all these improvements and substitutions should be regarded as falling into the protection scope of the present disclosure.

What is claimed is:

1. A method for manufacturing the white-light fluorescent material, comprising:
   step 1, preparing a precursor by using $SnCl_4 \cdot 5H_2O$ as a raw material;
   step 2, dissolving NaOH and a surfactant in water and then mixing NaOH and the surfactant, and stirring at room temperature for 0.5-2 h, thus obtaining a mineralizer, wherein a mass ratio of NaOH to the surfactant is 1:1-1:1.5; and
   step 3, mixing the precursor and the mineralizer and then stirring for homogenization, placing a resultant mixture into a hydrothermal reactor, reacting at 135-145° C. for 12-18 h, cooling the mixture to room temperature and then taking out a product obtained, diluting the product with deionized water and then adjusting a pH value of a system to neutral with dilute nitric acid, adding silver nitrate, irradiating the system with ultraviolet light while stirring, then drying and grinding, thus obtaining fluorescent powder of $SnO_2$ doped with Ag, wherein a molar ratio of Ag to $SnO_2$ is 0.0014-41007:1; wherein a molar ratio of silver nitrate added in step 3 to $SnCl_4 \cdot 5H_2O$ in the precursor is 0.0014-0.007:1.

2. The method according to claim 1, wherein step 1 of preparing the precursor comprises: obtaining $SnCl_4 \cdot 5H_2O$, adding an excessive amount of ammonia water until precipitate is no longer generated, filtering out the precipitate and washing the precipitate with deionized water for several times until no $Cl^-$ is contained, adding deionized water to the precipitate with a mass ratio of $SnCl_4 \cdot 5H_2O$ to the deionized water being 1:3.5-1:4, and shaking to form an emulsion, adjusting a pH value to 10.5 with ammonia water, placing the emulsion in a hydrothermal reactor, and holding the hydrothermal reactor at 180° C. for 4 h, cooling to room temperature and then taking out a product obtained, thus obtaining the precursor.

3. The method according to claim 1, wherein the surfactant in step 2 is cetyl trimethyl ammonium bromide.

4. The method according to claim 1, wherein a concentration of NaOH in a reaction system obtained by mixing the precursor and the mineralizer in step 3 is 0.25-0.45 mol/L.

5. The method according to claim 4, wherein the concentration of NaOH in the reaction system obtained by mixing the precursor and the mineralizer in step 3 is 0.35 mol/L.

6. The method according to claim 1, wherein a concentration of the surfactant in a reaction system obtained by mixing the precursor and the mineralizer in step 3 is 10-20 g/L.

7. The method according to claim 6, wherein the concentration of the surfactant in the reaction system obtained by mixing the precursor and the mineralizer in step 3 is 15 g/L.

8. The method according to claim 1, wherein an irradiation intensity of the ultraviolet light in step 3 is 160 $\mu W/cm^2$-180 $\mu W/cm^2$.

9. The method according to claim 8, wherein the irradiation intensity of the ultraviolet light in step 3 is 180 $\mu W/cm^2$.

10. The method according to claim 1, wherein an irradiation time of the ultraviolet light in step 3 is 1-2 h.

11. The method according to claim 1, wherein the drying in step 3 is performed at 70° C.

12. The method according to claim 1, wherein the step of mixing the precursor and the mineralizer and then stirring for homogenization, placing the resultant mixture into a hydrothermal reactor, reacting at 135-145° C. for 12-18 h in step 3 comprises: mixing the precursor and the mineralizer and then stirring for homogenization, placing the resultant mixture into the hydrothermal reactor, and reacting at 140° C. for 16 h.

* * * * *